United States Patent [19]
Gardner

[11] Patent Number: 6,033,943
[45] Date of Patent: *Mar. 7, 2000

[54] DUAL GATE OXIDE THICKNESS INTEGRATED CIRCUIT AND PROCESS FOR MAKING SAME

[75] Inventor: Mark I. Gardner, Cedar Creek, Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/702,270

[22] Filed: Aug. 23, 1996

[51] Int. Cl.$^7$ .............................................. H01L 21/8238
[52] U.S. Cl. ........................ 438/199; 438/218; 438/219
[58] Field of Search ..................... 257/369, 371, 257/410, 411, 412; 438/218, 219, 199

[56] References Cited

U.S. PATENT DOCUMENTS

| | | | |
|---|---|---|---|
| 4,098,618 | 7/1978 | Crowder et al. | 148/1.5 |
| 4,352,117 | 9/1982 | Cuomo et al. | 357/30 |
| 4,551,910 | 11/1985 | Patterson | 29/576 |
| 4,578,128 | 3/1986 | Mundt et al. | 438/433 |
| 4,682,407 | 7/1987 | Wilson et al. | 438/517 |

(List continued on next page.)

FOREIGN PATENT DOCUMENTS

| | | |
|---|---|---|
| 0216246 | 4/1987 | European Pat. Off. . |
| 0532260 | 3/1993 | European Pat. Off. . |
| 3032608 | 3/1981 | Germany ............................... 437/979 |
| 5-283678 | 10/1993 | Japan . |
| 7-297298 | 11/1995 | Japan . |

OTHER PUBLICATIONS

Wolf, S., Tauber R.N.; Silicon Processing for the VLSI Era vol. 1: Process Technology, Lattice Press, Sunset Beach, CA, p.p. 429–446, No Month Given 1986.

Wolf, S., Tauber R.N.; Silicon Processing for the VLSI Era vol. 3: The Submicron MOSFET, Sunset Beach, CA, p.p. 429–446, No Month Given 1995.

Yoshikawa et al., "An EPROM Cell Structure for EPLD's Compatible with Single Poly–Si Gate Process," IEEE Transactions on Electron Devices, vol. 37, No. 3, Mar. 1990, pp. 675–679.

Wolfe, S., "Silicon Processing For The VLSI Era," vol. 3, The Submicron Mosfet, Lattice Press, CA, 1995, pp. 495–496.

International Search Report for International Application No. PCT/US 97/09424 mailed Sep. 16, 1997.

(List continued on next page.)

*Primary Examiner*—John F. Niebling
*Assistant Examiner*—Christopher Lattin
*Attorney, Agent, or Firm*—Kelvin L. Daffer; Conley, Rose & Tayon

[57] ABSTRACT

A semiconductor manufacturing process for producing MOS integrated circuits having two gate oxide thickness is provided. A first gate dielectric is formed on an upper surface of a semiconductor substrate. Thereafter, a masking layer is deposited on the first dielectric layer and patterned such that the first dielectric layer is exposed above a second region of the semiconductor substrate. The semiconductor wafer is then subjected to a thermal oxidation process such that a second gate dielectric is formed within the exposed second region of the semiconductor substrate. The second gate dielectric preferably has an oxide thickness that is unequal to the oxide thickness of the first gate dielectric layer. Thereafter, gate structures and source/drain structures are fabricated such that the integrated circuit includes a first transistor having a first gate dielectric thickness and a second transistor having a second gate dielectric thickness. In this manner, the integrated circuit can include selected transistors having a thinner gate dielectric for improving the performance of these selected transistors. In one embodiment, the n-channel transistors in a CMOS integrated circuit have a thinner gate oxide than the p-channel devices.

17 Claims, 3 Drawing Sheets

U.S. PATENT DOCUMENTS

| | | | |
|---|---|---|---|
| 4,707,721 | 11/1987 | Ang et al. | 257/333 |
| 4,729,009 | 3/1988 | Ang | 257/411 |
| 4,743,566 | 5/1988 | Bastiaens et al. | 437/70 |
| 4,774,197 | 9/1988 | Haddad et al. | 438/585 |
| 4,776,925 | 10/1988 | Fossum et al. | 438/297 |
| 4,808,261 | 2/1989 | Ghidini et al. | 438/587 |
| 4,851,257 | 7/1989 | Young et al. | 438/618 |
| 4,866,002 | 9/1989 | Shizukuishi et al. | 438/217 |
| 4,897,365 | 1/1990 | Baldi et al. | 437/69 |
| 4,922,319 | 5/1990 | Fukushima | 257/379 |
| 5,043,780 | 8/1991 | Fazan et al. | 257/306 |
| 5,066,995 | 11/1991 | Young et al. | 257/371 |
| 5,082,797 | 1/1992 | Chan et al. | 438/255 |
| 5,102,832 | 4/1992 | Tuttle | 438/398 |
| 5,138,411 | 8/1992 | Sandhu | 257/296 |
| 5,141,882 | 8/1992 | Komori et al. | 438/450 |
| 5,158,463 | 10/1992 | Kim et al. | 438/205 |
| 5,172,200 | 12/1992 | Muragishi et al. | 257/315 |
| 5,191,509 | 3/1993 | Wen | 361/311 |
| 5,208,176 | 5/1993 | Ahmad et al. | 438/394 |
| 5,250,456 | 10/1993 | Bryant | 438/253 |
| 5,254,489 | 10/1993 | Nakata | 438/258 |
| 5,296,411 | 3/1994 | Gardner et al. | 437/238 |
| 5,308,787 | 5/1994 | Hong et al. | 438/440 |
| 5,316,965 | 5/1994 | Philipossian et al. | 437/70 |
| 5,316,981 | 5/1994 | Gardner et al. | 437/235 |
| 5,330,920 | 7/1994 | Soleimani et al. | 437/24 |
| 5,330,935 | 7/1994 | Dobuzinsky et al. | 438/767 |
| 5,340,764 | 8/1994 | Larsen et al. | 257/369 |
| 5,358,894 | 10/1994 | Fazan et al. | 438/440 |
| 5,362,685 | 11/1994 | Gardner et al. | 437/238 |
| 5,387,540 | 2/1995 | Poon et al. | 437/67 |
| 5,391,907 | 2/1995 | Jang | 257/396 |
| 5,432,114 | 7/1995 | O | 438/217 |
| 5,480,828 | 1/1996 | Hsu et al. | 438/275 |
| 5,498,577 | 3/1996 | Fulford, Jr. et al. | 437/228 |
| 5,502,009 | 3/1996 | Lin | 438/275 |
| 5,576,226 | 11/1996 | Hwang | 438/275 |
| 5,576,266 | 11/1996 | Flosenzier et al. | 503/227 |
| 5,576,570 | 11/1996 | Ohsawa et al. | 257/371 |
| 5,591,681 | 1/1997 | Wristers et al. | 437/240 |
| 5,604,159 | 2/1997 | Cooper et al. | 437/203 |
| 5,637,520 | 6/1997 | Cappelletti et al. | 438/258 |
| 5,672,521 | 9/1997 | Barsan et al. | 437/24 |
| 5,683,925 | 11/1997 | Irani et al. | 437/45 |
| 5,786,256 | 7/1998 | Gardner et al. | 438/305 |
| 5,789,305 | 8/1998 | Peidous | 438/439 |
| 5,851,893 | 12/1998 | Gardner et al. | 438/305 |
| 5,861,347 | 1/1999 | Maiti et al. | 438/787 |
| 5,872,376 | 2/1999 | Gardner et al. | 257/336 |
| 5,882,993 | 3/1999 | Gardner et al. | 438/591 |

OTHER PUBLICATIONS

Patent Abstracts of Japan, Publication No. 01183844; Publication Date: Jul. 21, 1989; Application Date: Jan. 19, 1988; Application No. 63008901.

Kuroi, et al "Novel NICE Structure For High Reliability and High Performance 0.25 micron Dual Gate CMOS", IEDM, pgs. 325–328. No month/y.

Molle, P. et al., "Nitrogen Implantation for Local Oxidation of Silicon," *Nuclear Instruments & Methods in Physics Research, Section—B: Beam Interactions with Materials and Atoms*, vol. B55, No. 1 / 04, Apr. 2, 1991, pp. 860–865.

Schott, K. et al., "Blocking of Silicon Oxidation by Low–Dose Nitrogen Implantation," Applied Physics A. Solids and Surfaces, vol. A45, No. 1, Jan. 1, 1988, pp. 73–76.

Doyle, B. et al., "Simultaneous Growth of Different Thickness Gate Oxides in Silicon CMOS Processing," IEEE Electron Device Letters, vol. 16, No. 7, Jul. 1995, pp. 301–302.

Ahn, J. et al., "High Quality Ultrathin Gate Dielectrics Formation by Thermal Oxidation of Si in N20," J. Electrochem. Soc. V. 139, No. 9, Sep. 1991, pp. L39–41.

Philipossian, A. et al., "Kinetics of Oxide Growth During Reoxidation of Lightly Nitrided Oxides," J. Electrochem. Soc. V. 139, No. 9, Sep. 1992, pp. L82–3.

Wolf, "Silicon Processing For the VLSI Era", vol. 1, Process Technology, pp. 198–218. 1986 No Month.

Naito et al., "Effect of Bottom Oxide on the Integrity of Interpolysilicon Ultrathin ONO Films," *Journal of the Electrochemical Society*, vol. 137, No. 2, Feb. 1, 1990, pp. 635–638.

Abbas et al., "Improvement of the Gate–Region Integrity in FET Devices," *IBM Technical Disclosure Bulletin*, vol. 14, No. 11, Apr. 1972, pp. 3348–3350.

Cheung, "Plasma Immersion Ion Implantation for ULSI Processing," *Trends & Applications*, 1991, pp. 811–820.

Wolf et al., "Silicon Processing for the VLSI Era, vol. 1, Process Technology," p. 321.

DUAL GATE OXIDE THICKNESS INTEGRATED CIRCUIT AND PROCESS FOR MAKING SAME

BACKGROUND OF THE INVENTION

1. Field of the Invention

The invention relates to the field of semiconductor processing and more particularly to a MOS integrated circuit in which select transistors are fabricated with a thinner gate oxide than the remaining transistors.

2. Description of the Relevant Art

Very large scale integrated (VLSI) metal-oxide-semiconductor ("MOS") circuits include a large number of interconnected transistors formed in a semiconductor substrate, typically comprised of silicon. Conventionally, the gate electrode of the MOS transistor functions as the transistor's input. The transistor is typically activated or turned on by driving the gate voltage ($V_G$) to a threshold value referred to as the threshold voltage ($V_T$). The drain current ($I_D$) of an MOS transistor typically serves as the transistor's output. Because the gate electrode of each transistor has a small but finite capacitance associated with it, the gate electrode cannot instantaneously achieve a desired change in voltage. Instead, a finite amount of time is required to charge the small gate capacitor to the appropriate voltage level. The amount of time required for a gate electrode to achieve a threshold level can be reduced by decreasing the capacitance of the gate electrode or increasing the drain current of transistors from preceding stages. Generally, for small values of drain voltage, $V_D$, (i.e., $V_D < V_G - V_T$), the drain current $I_D$ of an MOS transistor increases linearly with the drain voltage (assuming $V_G \geq V_T$). As $V_D$ is increased beyond this linear region, however, $I_D$ levels off and becomes substantially independent of $V_D$. This value of $I_D$ is commonly referred to as the saturated drain current, $I_{Dsat}$. In other words, $I_{Dsat}$ is the maximum drain current produced by an MOS transistor operating under normal biasing (i.e., $V_D \cong V_{CC}$, $|V_G| \geq |V_T|$, and $V_{SS} = 0$ V) for a given gate voltage. $I_{Dsat}$ is, therefore, a direct measure of the potential speed of an MOS circuit. Increasing $I_{Dsat}$ increases the integrated circuit's performance by enabling each transistor to drive subsequent stages of transistors to their threshold voltage in less time.

In the linear region, $I_D = k(V_G - V_{DS}/2) V_{DS}$, where $k = \mu C_{OX} W/L$. Inspection of this equation reveals that $I_D$ can be increased by increasing the oxide capacitance $C_{OX}$. In addition to increasing k, a larger oxide capacitance reduces the threshold voltages $V_T$ for the general case in which the total charge $Q_{TOT}$ trapped within the oxide and trapped at the oxide-silicon interface is relatively small. The capacitance, $C_{OX}$, of an MOS transistor is closely approximated by that of a parallel plate capacitor such that $C_{OX} \cong A \in /t_{OX}$, where A is the area of the gate structure, $\in$ is the permitivity of the dielectric, and $t_{OX}$ is the oxide thickness. Because it is undesirable to increase the area of the gate and difficult to alter the dielectric, increasing the capacitance $C_{OX}$ must be accomplished by decreasing the oxide thickness $t_{OX}$.

In many complementary metal oxide semiconductor (CMOS) processes, the gate structures for the transistors are formed from heavily doped polysilicon. To achieve a degree of symmetry between the p-channel and n-channel transistors, it is not uncommon to dope the gate structures of the n-channel devices with arsenic or phosphorous and the gate structures of the p-channel devices with boron. The doping of the p-channel polysilicon gate with boron can become problematic for thin gate oxide structures due to the relatively rapid rate at which boron diffuses through silicon dioxide.

In very thin oxide structures, (i.e., $t_{OX} \leq 3$ nm), boron ions from the heavily doped p+ polysilicon can diffuse through the oxide into the silicon bulk, thereby shifting the threshold voltage $V_T$ of the p-channel devices. This limitation on the thickness of the p-channel oxide has typically limited the oxide thickness of the n-channel devices as well because it is highly desirable from a manufacturing perspective to grow the capacitor or gate oxide non-selectively (i.e., grow the gate across the entire wafer rather than in selected or masked regions of the wafer). The blanket oxide growth tends to result in oxide thicknesses that are uniform across the entire wafer. Furthermore, conventional processing considerations teach away from multiple gate oxide thicknesses within a topography because of the asymmetry that would result from the use of such multiple thickness oxide topographies.

The desire to maintain symmetry has undesirably limited the potential performance of the n-channel devices in certain CMOS processes by restricting the minimum thickness of the gate oxide. More generally, symmetry considerations have prohibited designs in which selected critical transistors could be designated as high-performance, thin-oxide transistors. It would, therefore, be desirable to achieve a semiconductor manufacturing process in which selected transistors incorporate a gate oxide having a first thickness while the remaining transistors have a second gate oxide thickness without unduly complicating the process flow.

SUMMARY OF THE INVENTION

The problems identified above are in large part addressed by a manufacturing process for producing an integrated circuit having two gate oxide thicknesses. A first gate dielectric is formed on an upper surface of a semiconductor substrate. Thereafter, a masking layer is deposited on the first dielectric layer and patterned such that the first dielectric layer is exposed above a second region of the semiconductor substrate. The semiconductor wafer is then subjected to a thermal oxidation process such that a second gate dielectric is formed within the exposed second region of the semiconductor substrate. The second gate dielectric can have an oxide thickness that is unequal to the oxide thickness of the first gate dielectric layer. Thereafter, gate structures and source/drain structures are fabricated such that the integrated circuit includes a first transistor having a first gate dielectric thickness and a second transistor having a second gate dielectric thickness. In this manner, the integrated circuit can include selected transistors having a thinner gate dielectric for improving the performance of these select transistors. In one embodiment, the n-channel transistors in a CMOS integrated circuit have a thinner gate oxide than the p-channel devices.

Broadly speaking, the present invention contemplates a semiconductor process in which a semiconductor wafer is provided. The semiconductor wafer includes a semiconductor substrate comprising a first region and a second region. The first region is laterally displaced from the second region. A first dielectric layer is then formed on an upper surface of the semiconductor substrate. The first dielectric layer has a first thickness. A masking layer is then deposited on the first dielectric layer and patterned to expose the first dielectric layer above the second region of the semiconductor substrate. The wafer is then subjected to a oxygen-bearing ambient at a temperature of approximately 700–1000° C. such that a second dielectric layer is formed over the second region of the semiconductor substrate. The second dielectric layer has a second thickness. In one embodiment, the time during which the wafer is subjected to the high temperature ambient is such that the first thickness is greater than the second thickness while in another embodiment, the second thickness is greater than the first thickness. The masking layer is then removed from the upper surface of the first dielectric layer and gate structures are then formed on upper surfaces of the first and second dielectric layers, respectively. The first and second gate structures are laterally aligned over first and second channel regions within the semiconductor substrate. Impurities are then introduced into a first and a second pair of source/drain regions laterally displaced on either side of the first and second channel regions to form first and second transistors. The first dielectric layer serves as the gate dielectric for the first transistor while the second dielectric layer serves as the gate dielectric for the second transistor.

In a CMOS embodiment, the first region of a semiconductor substrate comprises p-type silicon and the second region of the semiconductor substrate comprises n-type silicon. In this embodiment, the thickness of the first dielectric layer is preferably less than the thickness of the second dielectric layer.

Preferably, the step of forming the first dielectric layer comprises subjecting the wafer to a first oxygen-bearing ambient at a temperature of approximately 700–1000° C. such that the first dielectric layer comprises a thermal oxide. In a presently preferred embodiment in which the first dielectric layer is thinner than the second dielectric layer, the first thickness is approximately 15–25 Angstroms. The step of depositing the masking layer preferably comprises chemical vapor depositing silicon nitride or polysilicon onto the upper surface of the first and second dielectric layers. The masking layer is preferably patterned by depositing a photoresist layer on the masking layer, selectively exposing the photoresist layer to an energy source to form exposed regions within the photoresist layer, and developing the photoresist layer by removing the exposed regions of the photoresist layer.

The first and second gate structures are formed by chemical vapor depositing a polysilicon layer on a surface cooperatively defined by an upper surface of the first dielectric layer and an upper surface of the second dielectric layer and patterning the polysilicon layer by doping the polysilicon layer with impurities such that a sheet resistivity of the first and second gate structures is less than approximately 500 Ω/sq, removing portions of the polysilicon layer exterior to a first channel region and a second channel region of the semiconductor substrate. The patterning of the polysilicon layer is preferably performed with conventional photoresist, photolithography, and etch processing steps. In a presently preferred CMOS embodiment in which the n-channel devices are formed over the first substrate region, the step of doping the polysilicon layer preferably comprises doping portions of the polysilicon layer over the first region of semiconductor substrate with n-type impurities and doping the polysilicon layer over second regions of the semiconductor substrate with a p-type impurity such as boron. The selective doping of the polysilicon layer can be accomplished with ion implantation steps in conjunction with conventional photoresist and photoresist masking steps.

The semiconductor process preferably further comprises forming an isolation dielectric structure laterally disposed between the first region and the second region of the semiconductor substrate prior to the forming of the first dielectric layer. In a presently preferred embodiment, the isolation dielectric structure comprises a shallow trench isolation.

Preferably, the step of introducing impurities into the source/drain regions comprises implanting ions selected from the group consisting of boron, arsenic, and phosphorus. Still more preferably, the implanting of ions comprises implanting phosphorus or arsenic ions into the first pair of source/drain regions and implanting boron ions into the second pair of source/drain regions.

The present invention further contemplates an MOS integrated circuit in which a semiconductor substrate comprises a first region and a second region which is laterally displaced from the first region. A first transistor is formed within the first region of the semiconductor substrate. The first gate dielectric of the first transistor has a first thickness. A second transistor is formed in the second region of the semiconductor substrate. The second gate dielectric of the second transistor has a second thickness. The second thickness is greater than the first thickness such that the first transistor has a greater oxide capacitance, $C_{OX}$, than the second transistor whereby the saturated drain current of transistors formed with the first gate dielectric is greater than similarly dimensioned transistors formed with the second gate dielectric.

Preferably, the semiconductor substrate of the integrated circuit comprises single crystal silicon in which the first region of the semiconductor substrate comprises p-type silicon and the second region of the semiconductor substrate comprises n-type silicon. In a presently preferred CMOS embodiment of the integrated circuit, the first transistor comprises an n-type polysilicon gate structure formed over the first gate dielectric and a pair of n-type source/drain regions formed within an upper surface of the semiconductor substrate. The n-type source/drain regions are laterally disposed on either side of a first channel region of the semiconductor substrate. The second transistor comprises a p-type polysilicon gate structure formed over the second gate dielectric layer. A pair of p-type source/drain regions are formed within an upper surface of the semiconductor substrate. The p-type source/drain regions are laterally disposed on either side of a second channel region of the semiconductor substrate. Still more preferably, the first thickness of the first gate dielectric is approximately 15–25 Angstroms while the second gate dielectric is approximately 30–50 Angstroms thick.

BRIEF DESCRIPTION OF THE DRAWINGS

Other objects and advantages of the present invention may become apparent upon reading the following detailed description and upon reference to the drawings in which.

Figure 1:
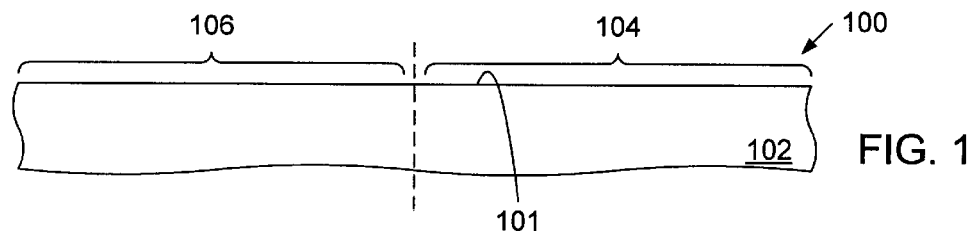
FIG. 1 is a partial cross-sectional view of a semiconductor wafer including a semiconductor substrate.

While the invention is susceptible to various modifications and alternative forms, specific embodiments thereof are shown by way of example in the drawings and will herein be described in detail. It should be understood, however, that the drawings and detailed descriptions thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning to the drawings, FIG. 1 shows a semiconductor wafer 100. The wafer 100 comprises a semiconductor substrate 102. The semiconductor substrate 102 includes a first region 104 laterally displaced from a second region 106. Preferably, the semiconductor substrate 102 comprises single crystal silicon. In a presently preferred CMOS embodiment, first region 104 of semiconductor substrate 102 comprises p-type silicon while second region 106 comprises n-type silicon. The p-type and n-type silicon shown in FIG. 1 may reside upon a silicon bulk (not shown in the drawing) preferably comprised of p-type silicon having a resistivity of approximately 12–15 Ω-cm. Semiconductor substrate 102 further includes upper surface 101.

Figure 2:
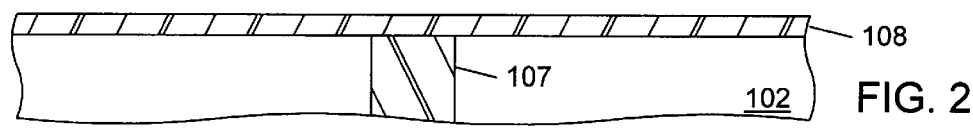
FIG. 2 is a processing step subsequent to FIG. 1, in which an isolation dielectric structure has been formed within the semiconductor substrate and a first gate dielectric layer has been formed on an upper surface of the semiconductor substrate.

Turning now to FIG. 2, isolation dielectric structure 107 is formed laterally displaced between first region 104 and second region 106 of semiconductor substrate 102. Isolation dielectric 107 is preferably comprised of an oxide such that first region and second region 106 of semiconductor substrate are electrically isolated from one another. In the presently preferred embodiment shown in FIG. 2, isolation dielectric structure 107 comprises a shallow trench isolation structure. Shallow trench isolation structures are formed by etching a trench shaped void into an upper surface of semiconductor substrate 102 such that the trench shaped void extends downward from upper surface 101. Thereafter, the trench shaped void is filled with a dielectric material, preferably a CVD oxide. Thereafter, portions of the dielectric material exterior to the trench are removed with a planarization step such as a chemical-mechanical polish possibly in conjunction with photoresist masking steps and wet and dry etch steps to produce an upper surface of isolation dielectric structure 107 that is substantially coplanar with upper surface 101 of semiconductor substrate 102. It should be understood, however, that alternative isolation structures are available. As an example, the shallow trench isolation structure 107 shown in FIG. 2 may be replaced with the well known local oxidation (LOCOS) structure. LOCOS structures are formed by selectively growing a thermal oxide in an upper surface of semiconductor substrate 102. The selective oxide growth is achieved by patterning a silicon nitride layer over the silicon substrate prior to the thermal oxidation step. While the LOCOS isolation process is well developed, it has the dual disadvantages of (1) producing a non-planar surface and (2) encroaching upon the active areas of the semiconductor substrate with the well-known bird's beak structure.

After the formation of isolation structure 107, first dielectric layer 108 is formed on upper surface 101 of semiconductor substrate 102. First dielectric layer 108 preferably comprises silicon dioxide formed with a conventional thermal oxidation step during which wafer 100 is subjected to a first high temperature, oxygen bearing ambient. The first high temperature, oxygen bearing ambient is preferably between 700 to 1000° C. First dielectric layer 108 can be formed in a batch process tube-type thermal oxidation furnace or, alternatively, with rapid thermal processing techniques. Rapid thermal processing involves rapidly heating a single wafer to a desired temperature and sustaining the wafer at the elevated temperature for a short duration, typically from a few seconds to a few minutes. By minimizing the time during which the wafer is heated, rapid thermal processing minimizes undesirable redistribution of any impurity concentrations that are present in the substrate such as the channel stop implant distribution or the well implant distributions in a CMOS process. When carried out in an oxygen bearing ambient, rapid thermal processing can result in the formation of an $SiO_2$ film, such as first dielectric layer 108, on the wafer surface.

The present invention contemplates an integrated circuit in which a first transistor has a gate oxide thickness that is different than the gate oxide thickness of a second transistor. In one embodiment, the gate oxide thickness of the first transistor formed within first region 104 of semiconductor substrate 102 is greater than the thickness of the gate oxide of the second transistor formed over the second region 106 of semiconductor substrate 102. In this embodiment, first dielectric layer 108 has a thickness of approximately 25–200 Angstroms. Alternatively, the oxide thickness of the transistor formed in first region 104 may be less than the oxide thickness of the transistor formed over second substrate 106. In this embodiment, a thickness of first dielectric 108 is approximately 15–25 Angstroms.

Figure 3:
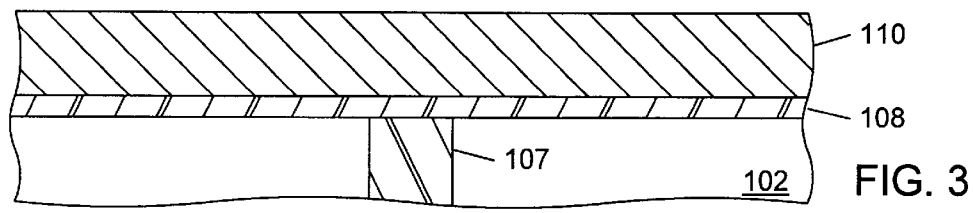
FIG. 3 is a processing step subsequent to FIG. 2, in which a masking layer has been formed on an upper surface of the first dielectric layer.

Turning to FIG. 3, a masking layer 110 is formed upon an upper surface of first dielectric layer 108. Preferably, masking layer 110 comprises CVD silicon nitride or polysilicon. In a presently preferred embodiment, the thickness of the masking layer 110 is approximately 100–1000 Angstroms. As an alternative to silicon nitride, masking layer 110 may comprise polycrystalline silicon (polysilicon).

Figure 4:
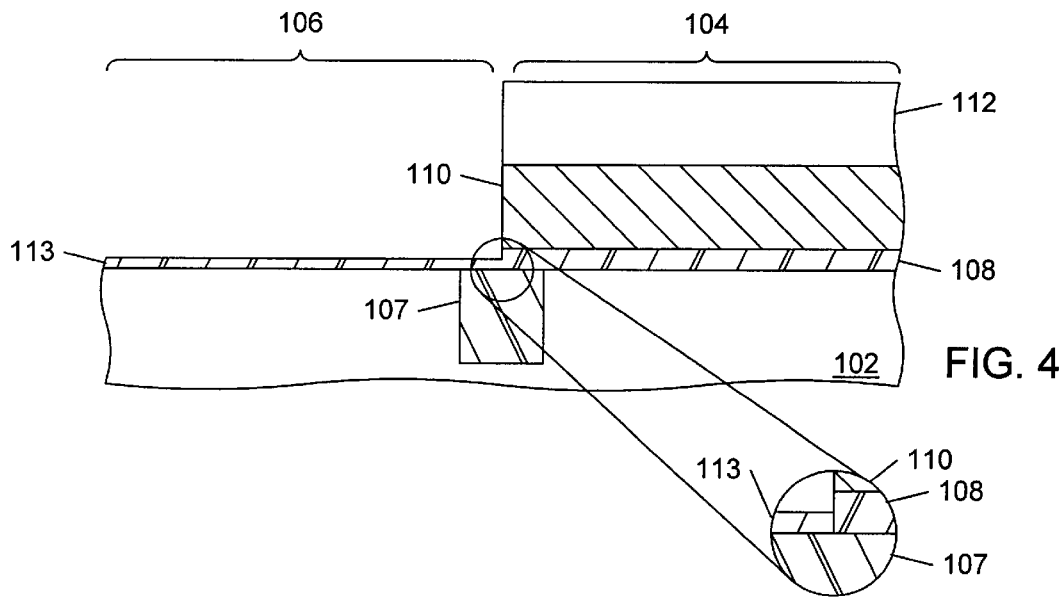
FIG. 4 is a processing step subsequent to FIG. 3, in which a photoresist layer has been formed on an upper surface of the masking layer and the masking layer and photoresist layer have been patterned to remove portions of those layers above a second region of the semiconductor substrate.
Figure 5:
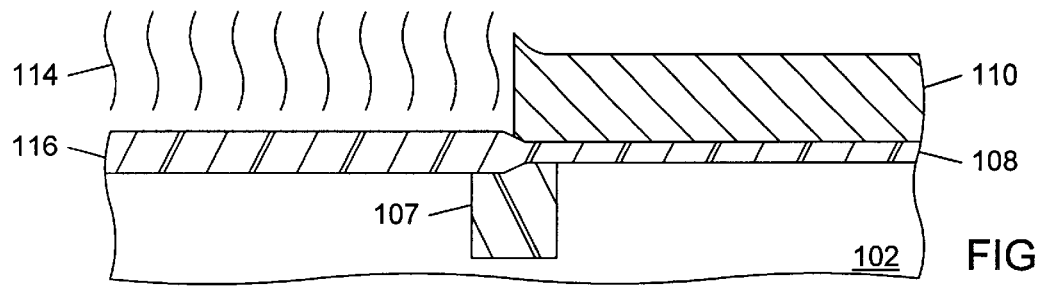
FIG. 5 is a processing step subsequent to FIG. 4, in which the semiconductor substrate is immersed in a high temperature oxygen-bearing ambient to form a second dielectric layer on an upper surface of the semiconductor substrate.
Figure 6:
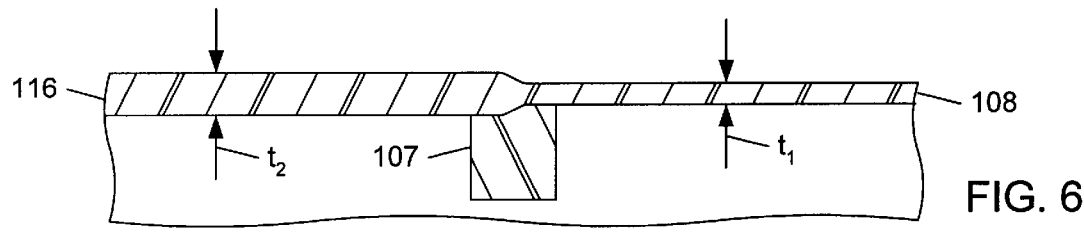
FIG. 6 is a processing step subsequent to FIG. 5, in which the masking layer has been removed from an upper surface of the first dielectric layer.
Figure 10:
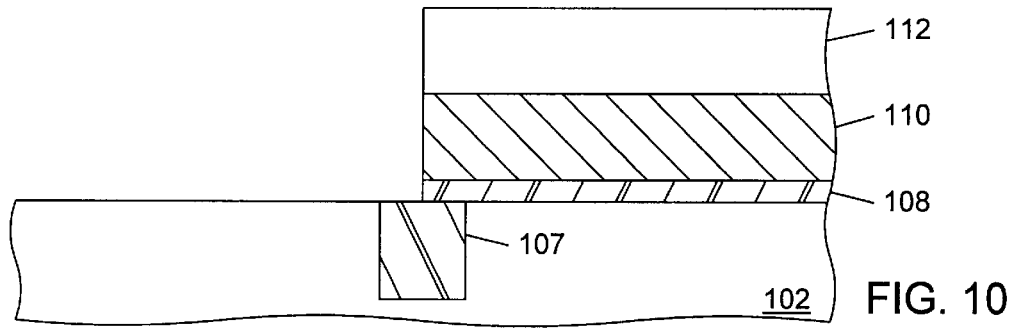
FIG. 10 is an alternative processing step subsequent to FIG. 4, in which the first oxide layer over the second substrate region has been removed.
Figure 11:
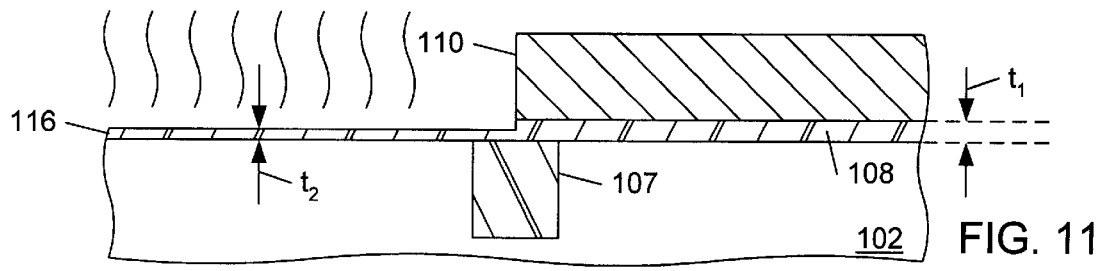
FIG. 11 is a processing step subsequent to FIG. 10, in which a second gate dielectric layer has been formed over the second region of the semiconductor substrate such that the thickness of the second gate dielectric is less than the thickness of the first gate dielectric.

Turning now to FIG. 4, photoresist layer 112 is deposited upon masking layer 110 prior to patterning photoresist layer 112 and masking layer 110. The patterning of photoresist layer 112 and masking layer 110 removes portions of the layers above second region 106 of semiconductor substrate 102. As will be appreciated to those skilled in the art, the patterning of masking layer 110 with either a wet or dry etch process can result in some etching of first dielectric layer 108 such that a residual oxide 113 having a thickness that is less than a thickness of first dielectric layer 108 is left over second region 106 of semiconductor substrate 102. Alternatively, the patterning of masking layer 110 may be performed such all of first dielectric layer 108 over second region 106 of semiconductor substrate 102 is removed. This alternative embodiment is shown in FIG. 10. Turning to FIG. 5, wafer 100 is immersed in a second high temperature, oxygen-bearing ambient 114 such that second dielectric layer 116 is formed over second region 106 of semiconductor substrate 102. High temperature ambient 114 comprises an oxygen bearing species such as $O_2$ or $H_2O$ at a temperature of approximately 700–1000° C. As is well known, an ambient such as high temperature, oxygen-bearing ambient 114 will interact with semiconductor substrate 102 to form a dielectric such as $SiO_2$. As discussed above with respect to FIG. 4 and FIG. 10, second dielectric layer 116 may be grown from no initial oxide as shown in FIG. 10 or may comprise a re-oxidation of residual oxide 113. In the embodiment shown in FIGS. 5 and 6, second dielectric layer 116 has a thickness $t_2$ that is greater than a thickness $t_1$ of first dielectric 108. In an alternative embodiment shown in FIG. 11, second dielectric 116 has a thickness $t_2$ that is less than a thickness $t_1$ of first dielectric 108. In the embodiment shown in FIG. 6 in which second dielectric 116 has a thickness that is greater than the thickness of first dielectric 108, first dielectric thickness $t_1$ is preferably between 15–25 Angstroms while second dielectric thickness $t_2$ has a thickness that is preferably between 30–200 Angstroms. In the embodiments shown in FIG. 11 in which second dielectric thickness $t_2$ is less than first dielectric thickness $t_1$, second dielectric $t_2$ preferably has a thickness that is approximately 15–25 Angstroms and first dielectric thickness $t_1$ is approximately 30–200 Angstroms. Second dielectric layer 116, like first dielectric layer 108 can be formed in a thermal oxidation furnace or in a rapid thermal processing apparatus.

Figure 7:
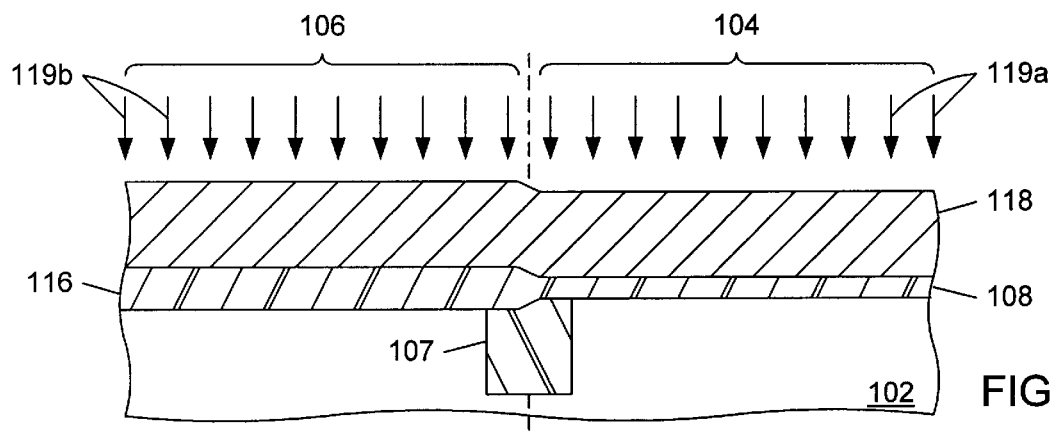
FIG. 7 is a processing step subsequent to FIG. 6, in which a conductive gate layer has been deposited on an upper surface of the first and second gate dielectric layers.
Figure 8:
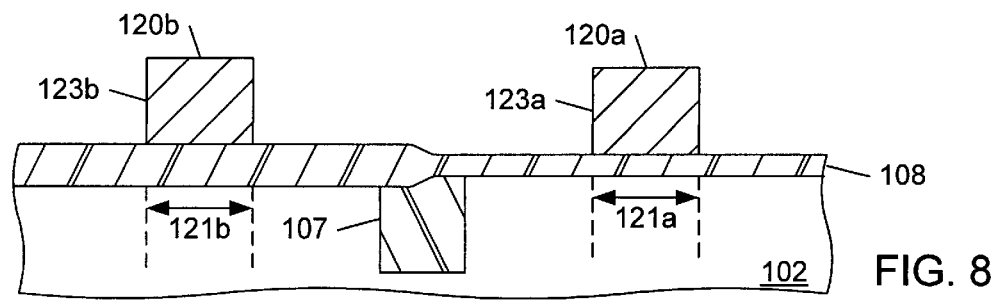
FIG. 8 is a processing step subsequent to FIG. 7, in which the conductive gate layer has been patterned to form first and second gate structures over the first and second regions of the semiconductor substrate, respectively.
Figure 9:
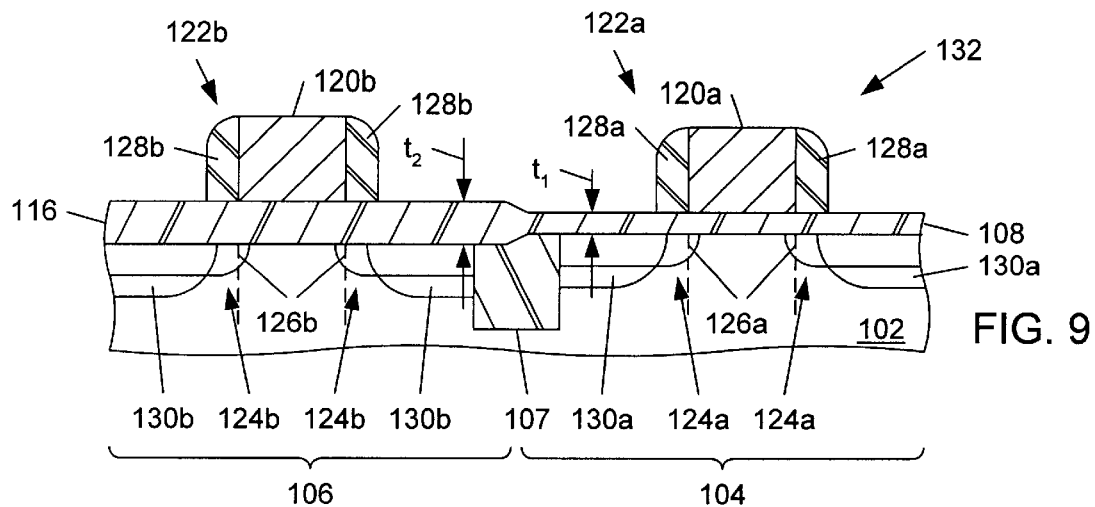
FIG. 9 is a processing step subsequent to FIG. 8, in which first and second transistors have been formed by introducing source/drain impurities into source/drain regions laterally displaced on either side of first and second channel regions within the semiconductor substrate.

FIGS. 7–9 show processing steps for forming transistors upon the dual oxide thicknesses. Although FIGS. 7–9 disclose an embodiment in which second dielectric 116 has a thickness $t_2$ that is greater than a thickness $t_1$ of first dielectric 108, it is to be understood that the processing steps shown in FIGS. 7–9 are equally applicable to an embodiment in which second dielectric layer 116 is thinner than first dielectric layer 108. Turning to FIG. 7, a conductive gate layer 118 is deposited upon a topography cooperatively defined by an upper surface of first dielectric layer 108 and second dielectric layer 116. Preferably, conductive gate layer 118 comprises CVD polysilicon. Also shown in FIG. 7 are processing steps 119a and 119b in which impurities are introduced into conductive gate layer 118 to reduce the sheet resistivity of conductive gate layer 118.

In an embodiment in which conductive gate layer 118 comprises CVD polysilicon, processing steps 119a and 119b result in a sheet resistivity of conductive gate layer 118 that is less than approximately 500 $\Omega$/sq. Processing steps 119a and 119b may comprise separate processing steps such that the portion of conductive gate layer 118 over first substrate region 104 is selectively doped with respect to a portion of conductive gate layer 118 over second substrate region 106. In a CMOS embodiment, for example, it is preferable to introduce p-type impurities into the gate structures of the p-channel devices and to introduce n-type impurities into the gate structures of the n-channel devices to minimize the asymmetry in the work functions of the p-channel and n-channel devices. Because the most prevalent p-type impurity is boron, which tends to diffuse through silicon dioxide at a much faster rate than either arsenic or phosphorus (the common n-type impurities), it is also desirable to utilize a slightly thicker gate oxide for the p-channel devices to minimize the threshold shifting of the p-channel devices due to boron diffusion through the gate dielectric. Accordingly, one embodiment of processing steps 119a and 119b contemplates a first implant 119a in which n-type impurities such as phosphorus or arsenic are introduced, preferably through an ion implantation, into conductive gate layer 118 over first region 104 of semiconductor substrate 102. This embodiment further contemplates a second processing step 119b in which p-type impurities such as boron are introduced into conductive layer 118 over second region 106 of semiconductor substrate 102. The selective introduction of the impurities into their corresponding regions of conductive layer 118 is carried out through the use of a conventional photoresist masking step.

It will be further understood, that in a CMOS embodiment in which second dielectric layer 116 is thinner than first dielectric layer 108, the p-type impurity will be introduced into the region of conductive gate layer 118 over first region 104 of semiconductor substrate 102. In other words, it is understood that the boron doping of conductive gate layer 118 is carried out over the thicker gate dielectric to minimize the threshold shifting as described above. It should also be understood that the present invention can be implemented in an NMOS process to produce an integrated circuit in which selected n-channel devices have a thinner gate oxide than the remaining n-channel devices. In such an embodiment, processing steps 119a and 119b may comprise a single processing step such as a single implant or a diffusion step subsequent to the deposition of first conductive layer 118.

FIG. 8 shows a processing step subsequent to FIG. 7 in which first and second gate structures 120a and 120b are formed over first and second channel regions 121a and 121b, respectively, of semiconductor substrate 102. The formation of gate structures 120 is preferably accomplished with a photolithography step, and more preferably in conjunction with a dry etch process such that gate structures 120 are formed with substantially vertical sidewalls 123a and 123b. Turning to FIG. 9, first and second transistors 122a and 122b are formed over first substrate region 104 and second substrate region 106, respectively of semiconductor substrate 102. Following the formation of gate structures 120, transistors 122 are formed by introducing impurities into source/drain regions 124 within an upper region of the semiconductor substrate 102. Source/drain regions 124 are laterally displaced on either side of channel regions 121 within semiconductor substrate 102. In the preferred embodiment shown in FIG. 9, source/drain regions 124 comprise LDD regions 126 and heavily implanted regions 130.

LDD regions 126 are used to reduce the maximum electric field within semiconductor substrate 102 to minimize the occurrence of hot electron injection. LDD regions 126 are formed by implanting a first concentration of a first impurity type into an upper region of semiconductor substrate 102. Thereafter, LDD spacers 128 are formed on sidewalls 123 of gate structures 120. The formation of spacer structures 128 comprises depositing a conformal dielectric layer such as a CVD oxide formed from a TEOS source and anisotropically etching the dielectric layer with minimum overetch such that the dielectric layer is just cleared from the planar regions of the topography. After spacer structures 128 have been formed, impurities are introduced into heavily doped regions 130 through a subsequent implantation step.

Generally, the peak doping concentration of LDD 126 is less than the peak doping concentration of heavily doped region 130. In a CMOS embodiment of the present invention, it will be appreciated that in the p-channel device which is formed over the thicker gate dielectric (second transistor 122b in the embodiment shown), LDD regions 126b and heavily doped regions 130b comprise a concentration of boron ions while the LDD region 126a and heavily doped region 130a of the n-channel transistor 122a formed over the thinner gate oxide comprise a concentration of n-type ions such as phosphorus or arsenic. The selective introduction of impurities into first substrate region 104 versus second substrate region 106 can be accomplished through the use of conventional photoresist masking steps. In an embodiment of the present invention in which first transistor 122a and second transistor 122b are both n-channel devices, it will be appreciated that the formation of source/drain regions 124a and 124b can be accomplished simultaneously.

Thus, FIG. 9 depicts an integrated circuit 132 comprising first transistor 122a and second transistor 122b. First transistor 122a is formed within first substrate region 104 of semiconductor substrate 102 and includes a first dielectric layer 108 having a first dielectric thickness $t_1$. Integrated circuit 132 further comprises second transistor 122b. Second transistor 122b comprises second dielectric layer 116 having a second dielectric thickness $t_2$. In the embodiment shown, second dielectric thickness $t_2$ is greater than first dielectric thickness $t_1$. In this manner, the capacitance, $C_{ox1}$, of first transistor 122a is substantially greater than the capacitance, $C_{ox2}$, of second transistor 122b. First transistor 122a will, therefore, demonstrate a higher saturated drain current $I_{Dsat}$ than a similarly dimensioned second transistor 122b. In a CMOS embodiment, first transistor 122a is an n-channel device such that first gate structure 120a comprises heavily doped n-type polysilicon and first source/drain regions 124a comprise an ion concentration of phosphorus or arsenic. In the CMOS embodiment, second transistor 122b is a p-channel device in which second gate structure 120b comprises heavily doped p-type polysilicon and second source/drain regions 124b comprise ion concentrations of boron. The thicker gate oxide of second dielectric layer 116 is used in conjunction with the p-channel transistor 122b to prevent boron diffusion through second dielectric 116 while permitting the optimization of n-channel transistor 122a by allowing a thinner first dielectric layer 108.

It will, therefore, be appreciated to those skilled in the art having the benefit of this disclosure that this invention is capable of producing an integrated circuit including dual oxide thicknesses for selective formation of high performance transistors within the integrated circuit. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor process, comprising:
   providing a semiconductor wafer, wherein said semiconductor wafer includes a semiconductor substrate comprising a first region and a second region laterally displaced from said first region;
   forming a first dielectric layer on an upper surface of said semiconductor substrate, wherein said first dielectric layer has a first thickness;
   depositing a masking layer on said first dielectric layer;
   patterning said masking layer to expose said first dielectric layer above said second region of said semiconductor substrate;
   while retaining at least a portion of said first dielectric layer above the entirety of said second region, subjecting said semiconductor wafer to an oxygen bearing ambient at a temperature of approximately 700 to 1000° C. such that a second dielectric layer is formed over said second region of said semiconductor substrate, wherein said second layer has a second thickness, and further wherein said second thickness is unequal to said first thickness;
   removing said masking layer from said upper surface of said first dielectric layer, subsequent to said subjecting;
   forming a first gate structure and a second gate structure on upper surfaces of said first dielectric layer and said second dielectric layer respectively; and
   introducing impurities into a first and second pair of source/drain regions laterally displaced on either side of said first and second channel regions respectively whereby first and second transistors are formed, wherein said first dielectric layer serves as a gate dielectric for said first transistor and said second dielectric layer serves as a gate dielectric for said second transistor.

2. The process of claim 1 wherein said first region of said semiconductor substrate comprises p-type silicon and said second region of said semiconductor substrate comprises n-type silicon.

3. The process of claim 1, wherein the step of forming said first dielectric layer comprises subjecting said semiconductor wafer to an additional oxygen bearing ambient at a temperature of approximately 700 to 1000° C. such that said first dielectric layer comprises a thermal oxide.

4. The process of claim 3, wherein said first thickness is approximately 15 to 25 angstroms.

5. The process of claim 1 wherein the step of depositing said masking layer comprises chemical vapor depositing a material selected from the group consisting of silicon nitride and polysilicon on said first dielectric layer.

6. The process of claim 1 wherein the step of patterning said masking layer, comprises:
   depositing a photoresist layer on said masking layer;
   selectively exposing said photoresist layer to an energy source to form exposed regions of said photoresist layer; and
   developing said photoresist layer such that said exposed regions of said photoresist layer are removed.

7. The process of claim 1, wherein the step of forming said first and second gate structures comprises:
   chemical vapor depositing a polysilicon layer on a surface cooperatively defined by an upper surface of said first dielectric layer and an upper surface of said second dielectric layer;
   patterning said polysilicon layer to remove portions of said polysilicon layer exterior to a first channel region and a second channel region of said semiconductor substrate such that said first and second gate structures are formed; and
   doping said first and second gate structures with impurities such that a sheet resistivity of said first and second gate structures is less than 500 Ω/sq.

8. The process of claim 7, wherein the step of doping said first and second gate structures comprises doping said first gate structure with a first impurity chosen from the group consisting of phosphorous and arsenic and doping said second gate structure with boron.

9. The process of claim 1, further comprising, prior to the step of forming said first dielectric layer, forming an isolation dielectric structure laterally disposed between said first region and said second region of said semiconductor substrate.

10. The process of claim 9, wherein the step of forming said isolation dielectric structure comprises:

etching a trench shaped void into said semiconductor substrate, said trench-shaped void extending downward from said upper surface of said semiconductor substrate;

filling said trench shaped void with a fill dielectric layer; and removing said fill dielectric layer from regions exterior to said trench shaped dielectric such that an upper surface of said fill dielectric layer is substantially planar with said upper surface of said semiconductor substrate.

11. The process of claim 1 wherein said the step of introducing impurities into said source/drain regions comprises implanting ions selected from the group consisting of boron, arsenic, and phosphorous.

12. The process of claim 11 wherein the step of implanting ions comprises implanting ions selected from the group consisting of phosphorous and arsenic into said first pair of source/drain regions and implanting boron ions into said second pair of source/drain regions.

13. The process of claim 1, wherein said first thickness is less than said second thickness.

14. The process of claim 1, wherein said first thickness is greater than said second thickness.

15. The method of claim 5, wherein said chemical vapor depositing a material comprises chemical vapor depositing polysilicon.

16. A semiconductor process, comprising:

providing a semiconductor wafer, wherein said semiconductor wafer includes a semiconductor substrate comprising a first region and a second region laterally displaced from said first region;

forming a first dielectric layer on an upper surface of said semiconductor substrate, wherein said first dielectric layer has a first thickness;

depositing a polysilicon masking layer on said first dielectric layer;

patterning said masking layer to expose said first dielectric layer above said second region of said semiconductor substrate;

while retaining at least a portion of said first dielectric layer above the entirety of said second region, subjecting said semiconductor wafer to an oxygen bearing ambient at a temperature of approximately 700 to 1000° C. such that a second dielectric layer is formed over said second region of said semiconductor substrate, wherein said second layer has a second thickness, and further wherein said second thickness is unequal to said first thickness;

removing said masking layer from said upper surface of said first dielectric layer;

forming a first gate structure and a second gate structure on upper surfaces of said first dielectric layer and said second dielectric layer respectively; and introducing impurities into a first and second pair of source/drain regions laterally displaced on either side of said first and second channel regions respectively whereby first and second transistors are formed, wherein said first dielectric layer serves as a gate dielectric for said first transistor and said second dielectric layer serves as a gate dielectric for said second transistor.

17. The process of claim 16, wherein said first region of said semiconductor substrate comprises p-type silicon and said second region of said semiconductor substrate comprises n-type silicon.

* * * * *